(12) United States Patent
Chiu

(10) Patent No.: US 6,711,627 B2
(45) Date of Patent: Mar. 23, 2004

(54) METHOD FOR SCHEDULING EXECUTION SEQUENCE OF READ AND WRITE OPERATIONS

(75) Inventor: You-Ming Chiu, Taipei (TW)

(73) Assignee: Via Technologies, Inc., Taipei (TW)

( * ) Notice: Subject to any disclaimer, the term of this patent is extended or adjusted under 35 U.S.C. 154(b) by 335 days.

(21) Appl. No.: 09/875,200

(22) Filed: Jun. 7, 2001

(65) Prior Publication Data

US 2002/0019890 A1 Feb. 14, 2002

(30) Foreign Application Priority Data

Jun. 8, 2000 (TW) ....................................... 89111196 A

(51) Int. Cl.$^7$ ................................................ G06F 3/00
(52) U.S. Cl. ............................... 710/6; 710/31; 710/40
(58) Field of Search ............................... 710/6, 36, 39, 710/29, 31, 33, 37, 40, 52; 711/150, 151, 154

(56) References Cited

U.S. PATENT DOCUMENTS

| | | | |
|---|---|---|---|
| 5,948,081 A | * | 9/1999 | Foster .......................... 710/40 |
| 6,202,101 B1 | * | 3/2001 | Chin et al. ..................... 710/5 |
| 6,292,807 B1 | * | 9/2001 | Larson ......................... 707/201 |
| 6,295,586 B1 | * | 9/2001 | Novak et al. ................ 711/154 |
| 6,321,233 B1 | * | 11/2001 | Larson ......................... 707/201 |

* cited by examiner

Primary Examiner—Jeffrey Gaffin
Assistant Examiner—David Martinez
(74) Attorney, Agent, or Firm—Rabin & Berdo, P.C.

(57) ABSTRACT

A method for scheduling execution sequence of read and write operations is disclosed, which is used for controlling the read and write operations between a first device and a second device. First, if there are more than two write operations waiting to be executed, the write operations are executed only after the completion of all of the read operations. If there are no more than two write operations waiting to be executed and there are read operations waiting to be executed, all of the read operations are to be executed when the read operation to be executed is associated with a data address different from the data address associated with the write operation next to the read operation. After all of the read operations are executed, the write operations are to be executed.

20 Claims, 6 Drawing Sheets

METHOD FOR SCHEDULING EXECUTION SEQUENCE OF READ AND WRITE OPERATIONS

This application claims the benefit of Taiwanese application Serial No. 89111196, filed on Jun. 8, 2000.

BACKGROUND OF THE INVENTION

1. Field of the Invention

The present invention relates to a method for scheduling execution sequence. More particularly, the present invention relates to a method for scheduling execution sequence of read/write operation suitable for a computer system.

2. Description of the Related Art

There are two major operations for a central process unit (CPU) to access a dynamic random access memory (DRAM): one is the read operation and the other is the write operation. Different operational characteristics exist between the read and write operations for the CPU, and therefore if we can aptly arrange the read and write operations, it can be executed faster and with more efficiency.

FIG. 1 shows a block diagram of a part of a computer system. Referring to FIG. 1, when the CPU 102 intends to write data into or read data from the DRAM 104, the CPU pushes a write request W or read request R into a write queue 108 or a read queue 110 respectively within a control unit 106. After it is processed by the control unit 106, the write request W or the read request R is popped from the write queue 108 or the read queue 110 respectively. While the write request W or the read request R is popped, the write or read operation is executed and controlled by a DRAM bus state machine 112 in the control unit 106. For example, if there are three data to be written or read, three corresponding write requests WA, WB, and WC or three corresponding read requests RA, RB, and RC are asserted. Then, the write operation includes write commands WCMD_A, WCMD_B, and WCMD_C, and the corresponding written data WDATA_A, WDATA_B and WDATA_C. If the read requests are asserted, the read operation includes read commands RCMD_A, RCMD_B, and RCMD_C, and the corresponding read data RDATA_A, RDATA_B, and RDATA_C. The DRAM bus state machine 112 detects the status of the DRAM bus for transmitting the write command WCMD, written data WDATA, or read command RCMD to the DRAM 104, and the DRAM 104 sends read data RDATA.

FIG. 2 is a timing chart for illustrating the CPU performing read/write operations to the DRAM according to the conventional method. Referring to FIG. 2, the conventional method is performed according to a sequence queuing the write and read requests. The read queue signal R_Queue shows a timing relation that read requests RA, RB, and RC are respectively pushed into the read queue 110, and the write queue signal W_Queue shows a timing relation that write requests WA, and WB are respectively pushed into the write queue 108. The pop signal POP represents a time sequence that the write requests WA, and WB queued in the write queue 108 and read requests RA, RB, and RC queued in the read queue 110 are popped. For example, according to a time sequence that the write requests and the read requests are sequentially and respectively queued in the write queue 108 and the read queue 110, the read requests RA, RB, the write requests WA, WB, and the read request RC are sequentially popped. Signal CLK is the system clock, and the read commands RCMD_A, RCMD_B the write commands WCMD_A WCMD_B, and the read command RCMD_C are sequentially asserted on the command signal line CMD. As the data line DATA detects the commands RCMD_A, RCMD_B WCMD_A, WCMD_B, and RCMD_C, the corresponding data RDATA_A, RDATA_B WDATA_A WDATA_B and RDATA_C are transmitted on the data line DATA.

Among these bus signals, the write command WCMD, the write data WDATA and the read command RCMD are transmitted from the CPU 102 to the DRAM 104 and thus they are called down signals, while the read data RDATA is transmitted from the DRAM 104 to the CPU 102, which is called an up signal. Therefore, there must exist a turn around cycle, such as time interval t1 or t2 shown in FIG. 2, between the up and down signals because the DRAM bus has to change its transmission direction. If the turn around cycle can be reduced, data transmission rate can be increased.

Furthermore, the CPU 102 sometimes needs to read related data for executing a program because the read operation depends on the program. However, with respect to the DRAM 104, the dependence between the write operation and an executed program is not as related as the read operation. Therefore, the read operation is more important and necessary than the write operation for the CPU 102, and so the priority of the read operation is higher than that of the write operation, for which the read operation will be performed in advance to benefit the CPU's task.

As mentioned above, the conventional method utilizes a method termed read around write (RAW) to perform the read operation first. Generally there are many RAW methods used, and read around pre write (RAPW) is used as an example to explain the conventional method. FIG. 3 is a timing diagram for illustrating the read and write operations using the RAPW method. As shown in FIG. 3, from the read queue signal R_Queue and the write queue signal W_Queue, the read and write requests are pushed into the read queue 110 and the write queue 108 respectively in a sequence of read requests RA, RB, write requests WA, WB, and read request RC. According to the conventional RAPW method, the read operation can run around a write operation ahead of the read operation and be performed first. As shown in FIG. 3, the pop sequence accordingly becomes read requests RA, RB, write request WA, read request RA and write request WB. While read requests RA and RB are sequentially popped, read commands RCMD_A and RCMD_B are asserted on the command signal line CMD. Processed by the DRAM 104, the corresponding read data RDATA_A and RDATA_B are sent out through the data signal line DATA, in which if each read data contains four data, it needs four cycles to complete each read operation as shown in FIG. 3. Afterwards, the write command WCMD_A and write data WDATA_A are sent to the DRAM 104 through the command signal line CMD and the data signal line DATA respectively. A turn around cycle, namely the time interval t1, exists between the read data RDATA_B and the write data WDATA_A. Similarly, the read command RCMD_C is asserted on the command signal line CMD and then the read data is sent out of the DRAM 104. Then, the write command WCMD_B and write data WDATA_B are sent to the DRAM 104 through the command signal line CMD and the data signal line DATA respectively. As shown in FIG. 3, it requires three turn around cycles, the time intervals t1, t2 and t3, for performing the read and write operations by the RAPW method.

As discussed above, in the RAPW method, the read operation can only run around one write operation ahead it, and therefore, at the most the write queue 108 can reserve one write command WCMD therein. After the write request WB is pushed into the write queue 108, the write request WA can be popped. The DRAM bus status machine 112 sends the write command WCMD_A, depending on the status of the DRAM bus. The read request RC is pushed into the read queue 110 after the write request WB, but the read request RC must be popped before the write request WB according to the RAPW method. Namely, the read command RCMD_C has to be sent before the write command WCMD_B. As a result, after the write data WDATA_A is sent to the DRAM 104 through the data signal line DATA, the read data RDATA_C is sent out of the DRAM 104 and the write data WDATA_B is sent to the DRAM 104 in turn. Therefore, three turn around cycles occur, decreasing the data transmission rate.

Furthermore, according to the RAPW method, the read request RC has to be popped first before the write request WB. However, if addresses corresponding to the read request RC and the write request WB are the same, address hit occurs, causing a wrong result for the read data RDATA_C. Because both addresses are the same, actually the write command WCMD_B and the write data have to be sent before the read command RCMD_C and the read data RDATA_C are sent in order to have correct result.

SUMMARY OF THE INVENTION

Accordingly, it is a major objective of the present invention to provide a method for scheduling execution sequence of read/write operation. It first determines whether all of the read data are completely transmitted; i.e., it determines whether there are no data to be transmitted on the bus data line. If there are no data to be transmitted on the bus data line, the write operation is activated. In addition, by suitably scheduling the sequence of the write and read operations, the address hit problem can be solved and the turn around cycles are reduced. Therefore, the read and write operations are accelerated and the executing time can be reduced.

According to the object of the invention, the invention provides a method for scheduling execution sequence of read and write operations, which is used for controlling the read and write operations between a first device and a second device. First, in step (1), whether there are read or write operations waiting to be executed between the first and the second devices is determined. If so, the method proceeds to step (2); otherwise the method ends. In step (2), it is determined whether there are more than two write operations are waiting to be executed. If so, the method proceeds to step (3); otherwise it proceeds to step (4). In step (3), it is determined whether all read operations are completed. If so, the method proceeds to step (6); otherwise it proceeds to step (4). In step (4), it is determined whether there are read operations waiting to be being executed. If so, the method proceeds to step (5); otherwise step (3) is repeated. In step (5), a determination of whether address hit occurs is made. If so, the method proceeds to step (6) and then repeats step (1). In step (6), the write operations are executed and then step (1) is repeated. An address hit mentioned above indicates that when a read operation is executed, a write operation next to the read operation corresponds to the identical data address corresponding to the read operation.

The present invention further provides a method for scheduling execution sequence of read and write operations, which is used for controlling the read and write operations between a first device and a second device. In step (1), if there is no read or write operation waiting to be executed between the first and the second devices, the method is terminated. In step (2), a plurality of read requests of the read operations and a plurality of write requests of the write operations are respectively stored into a read queue and a write queue. In step (3), the method proceeds to step (4) when there are more than two write requests in the write queue; otherwise it proceeds to step (5). In step (4), the method proceeds to step (6) when all the read operations are completed; otherwise it proceeds to step (5). In step (5), the method proceeds to step (7) when read requests are still queued in the read queue; otherwise it repeats step (4). In step (6), the write requests are popped from the write queue, and the first device executes the write operations with the second device, and step (1) is repeated. In step (7), one of the read requests is popped from the read queue when no address hit occurred, and the first device executes the read operation with the second device; otherwise step (6) is repeated. An address hit indicates that when a read operation is executed, a write operation next to the read operation corresponds to the identical data address corresponding to the read operation.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENTS

The present invention intends that similar operations can be consecutively executed, for which turn around cycles can be reduced and transmission time can be reduced. In addition, since the read operations of the CPU 102 are program dependent, the priority of the read operations must be greater than that of the write operations. Since the read operations requires more time than the write operations, time intervals between the read operations can be used for executing the write operations.

Figure 4:
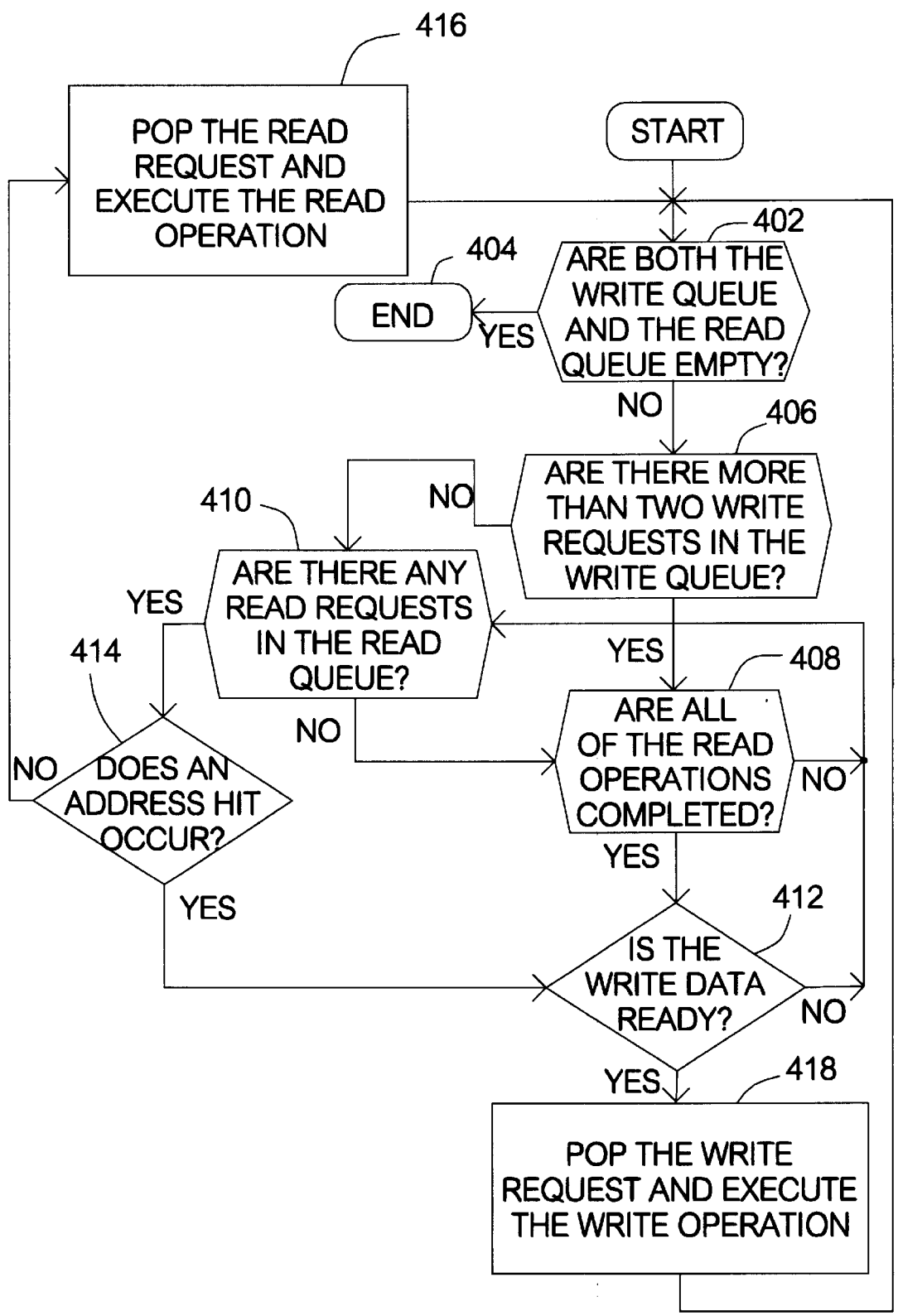
FIG. 4 is a flow chart illustrating a method for scheduling execution sequence of read and write operations according to the present invention.

FIG. 4 is a flow chart illustrating a method for scheduling execution sequence of read and write operations according to the present invention, in which step 402 is executed first. The write queue 108 and the read queue 110 are determined in advance whether or not they are empty. Namely, it determines whether the CPU 102 is prepared to execute the read or write operations. If the write or read operations are waiting for being executing, the write requests W and the read requests R are pushed into the write queue 108 and read queue 110 respectively. Conversely, if the write queue 108 and the read queue 110 are empty, the method proceeds to step 404 to terminate the scheduling process; if not empty, it proceeds to step 406. In the step 406, so it is determined whether there are more than two write requests W in the write queue 108; i.e., whether the CPU 102 is prepared to execute more than two write operations. If so, the method proceeds to step 408; otherwise step 410 is executed.

In step 408, it is determined whether all of the read operations are completed. For explaining step 408, the detailed operations when the CPU 102 performs a read operation to read data from the DRAM 110 are described. First, the read request R is popped from the read queue 110. The DRAM bus state machine then transmits a read command RCMD to the DRAM 104. Finally, the DRAM 104, in response to the read command RCMD, sends the data RDATA to the CPU 102. In this way, step 408 mainly determines whether the read data RDATA is transmitted completely; i.e., whether there are no read data RDATA being transmitted on the data signal line DATA. If the read data RDATA is transmitted completely, the method proceeds to step 412; otherwise it proceeds to step 410.

In step 410, it is determined whether there are read requests R in the read queue 110, i.e., whether the CPU 102 is to execute read operations. If so, the method proceeds to step 414; otherwise step 408 is repeated.

In step 412, it is determined whether the write data WDATA is ready. This is necessary because both the write command WCMD and the write data WDATA must be transmitted simultaneously. If the write data WDATA is ready, the method proceeds to step 418; otherwise step 410 is repeated.

In step 414, it is determined whether an address hit has occurred. An address hit indicates that a data address of a read data RDATA associated with a currently popped read request R from the read queue 110 is the same as that of a write data WDATA associated with a write request W stored in the write queue 108. If there is no write request W in the write queue 108, no address hit is possible. If an address hit is detected, the method returns to step 412; otherwise it proceeds to step 416.

In step 416, the read request R is popped and the corresponding read operation is executed. Namely, a read request R is popped from the read queue 110 and then the DRAM bus state machine 112 sends a read command RCMD according to the status of the bus. The DRAM 104 then transmits the read data RDATA to the CPU 102 through the control unit 106. After step 416 is completed, the method returns to step 402.

In step 418, the write request W is popped and the corresponding write operation is executed. Namely, a write request W is popped from the write queue 108 and then the DRAM bus state machine 112 sends a write command WCMD and a write data WDATA simultaneously to the DRAM 104 through the bus 114. After step 418 is completed, the method returns to step 402. In this way, the method repeats until all of the read and write operations are completed.

Figure 5:
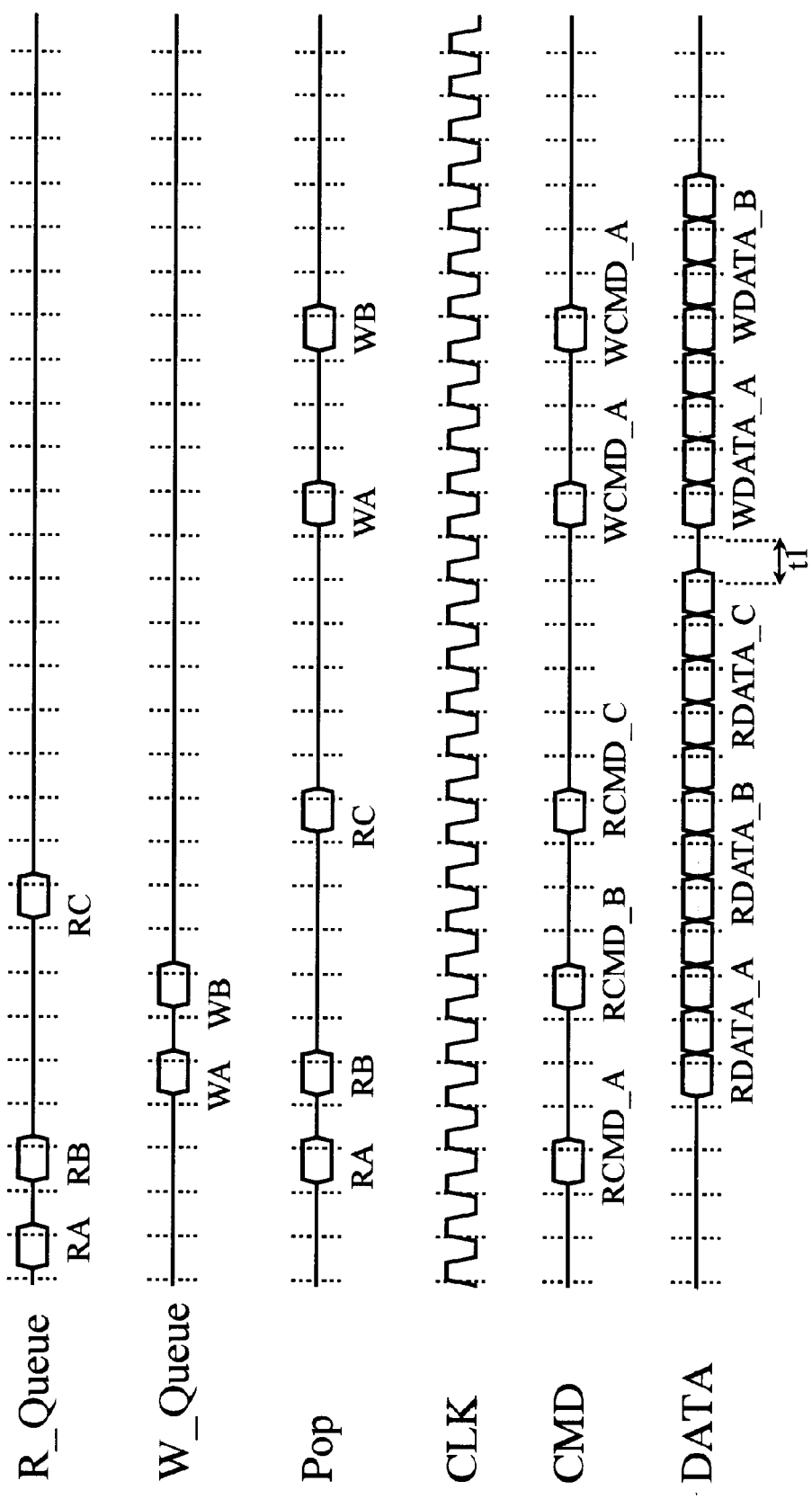
FIG. 5 is an exemplary timing diagram showing the write and read operations according to the method in FIG. 4.

FIG. 5 is an exemplary timing diagram showing the write and read operations according to the method in FIG. 4. Referring to FIG. 5, it is assumed that each write data WDATA or read data RDATA includes four data items and thus four clock cycle are needed to complete all data transmission. In regard to the read queue signal R_Queue, as the read request RA is pushed into the read queue 110, steps 402 and 406 are executed before proceeding to step 410. Meanwhile, the read request RA is in the read queue 110 and therefore the method proceeds to steps 414 and 416. Accordingly, in the pop signal Pop, the read request RA is popped and the read operation is executed. Namely, the read command RCMD_A is transmitted through the bus command signal line CMD, and the DRAM 104 sends the required read data RDATA_A before returning to step 402. At this time, as shown in FIG. 5, a read request RB is further pushed into the read queue 110 but no write request is in the write queue 108. Therefore, steps 414 and 416 are performed again. Namely, the read request RB is popped from the read queue 110, a read command RCMD is transmitted, and the DRAM 104 sends the corresponding read data RDATA_B to the CPU 102. Afterwards, the method returns to step 402.

In regard to the write queue signal W_Queue, during the period that the write requests WA and WB are respectively pushed into the write queue 108, the method is proceeding from 410 to step 408. At the same time, the read operation is still being executed, and therefore the method returns to step 410. After the read request RC is pushed into the read queue 110, the method proceeds to step 414. In step 414, it is determined whether the address of the read data RDATA_C associated with the read request RC is identical to either the address of the write data WDATA_B associated with the write request WB, or the address of the write data WDATA_A associated with the write request WA. If they are different, the method proceeds to step 416 for popping the read request RC and then executing the read operation. Namely, the read command RCMD_C is transmitted to the DRAM 104 and the DRAM 104 sends read data RDATA_C to the CPU 102.

Next, step 402 is executed. Because there are two write requests WA and WB in the write queue 108, the method proceeds to step 408. After all of the read operations are completed; i.e., the DRAM 104 finishes the transmission of the read data RDATA, the method then proceeds to step 412. If the write data WDATA is ready, then step 418 is performed for popping the write request WA and then executing the write operation. At the same time, the write command WCMD_A is transmitted through the bus command line CMD, and the write data WDATA_A is simultaneously transmitted through the bus data signal line DATA. After the transmission of the write data WDATA_A is completed, the method returns to step 402. At this time, there is only one write request WB in the write queue 108. Finally, the write command WCMD_B and write data WDATA_B are asserted for executing the write operation. As shown in FIG. 5, only one turn around cycle, i.e., the time interval t1, is required.

Figure 6:
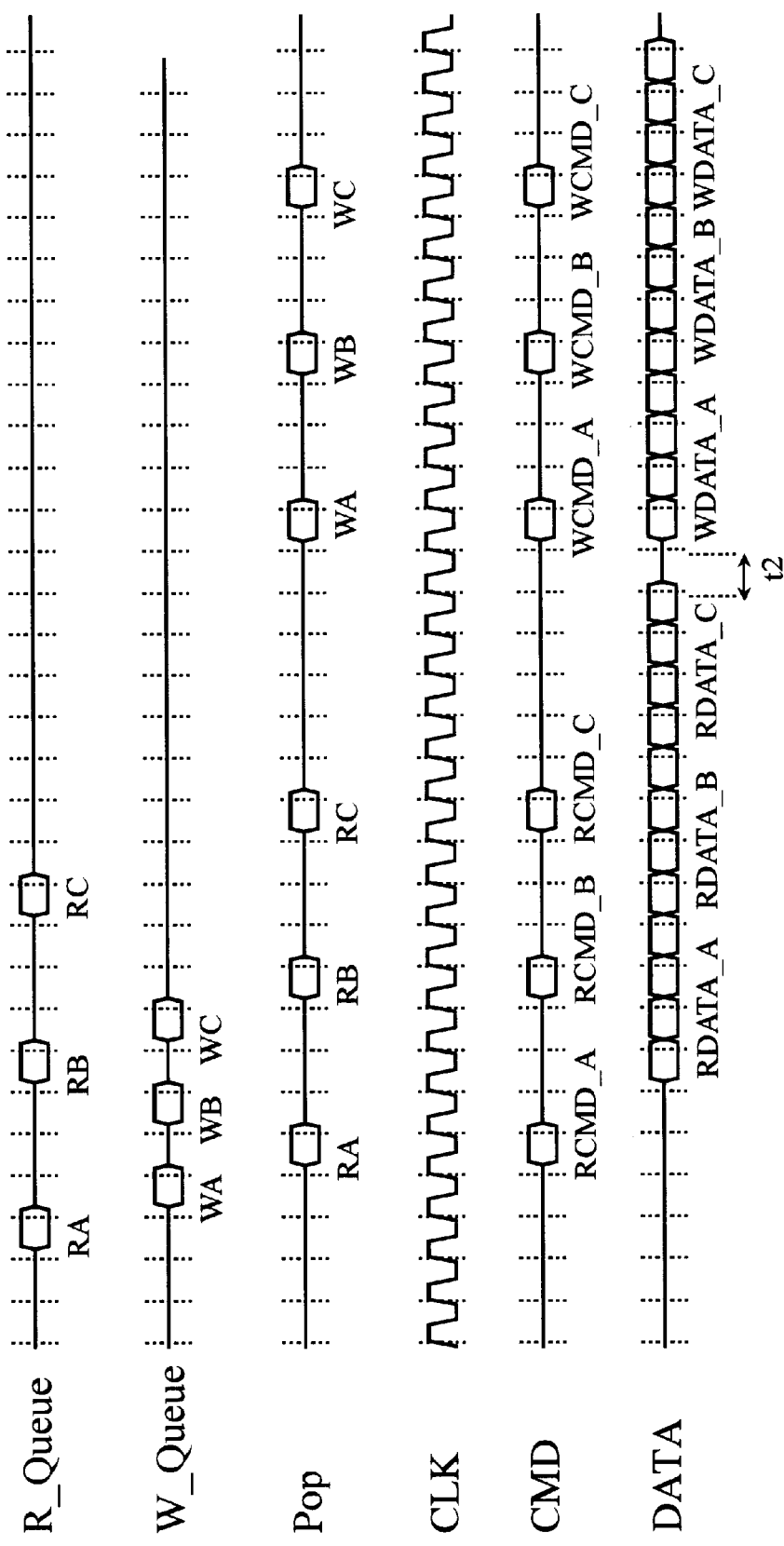
FIG. 6 is another exemplary timing diagram showing the write and read operations according to the method in FIG. 4.

FIG. 6 is another exemplary timing diagram showing the write and read operations according to the method in FIG. 4. Similarly, assume that the sequence of pushing the read requests and write requests into the read queue 110 and write queue 108 respectively is read request RA, write request WA, write request WB, read request RB, write request WC, and read request RC. According to the flow control shown FIG. 4, the pop sequence is read request RA, read request RB, read request RC, write request WA, write request WB, and write request WC. When write request WB is pushing into the write queue 108, the method proceeds to step 408 according to the judgement made at step 406. However, the read operation is not completed and the method proceeds to step 410 for popping the read requests RB and RC respectively and then executing the corresponding read operations. Accordingly, the sequence transmitted through the bus command signal line CMD is the read command RCMD_A, read command RCMD_B, read command RCMD_C, write command WCMD_A, write command WCMD_B, and write command WCMD_C. After the read data RDATA_A, RDATA_B, and RDATA_C are sent from the DRAM 104, the write data WDATA_A, WDATA_B and WDATA_C are in turn transmitted to the DRAM 104. As shown in FIG. 5, only one turn around cycle, i.e., the time interval t1, is required.

Figure 1:
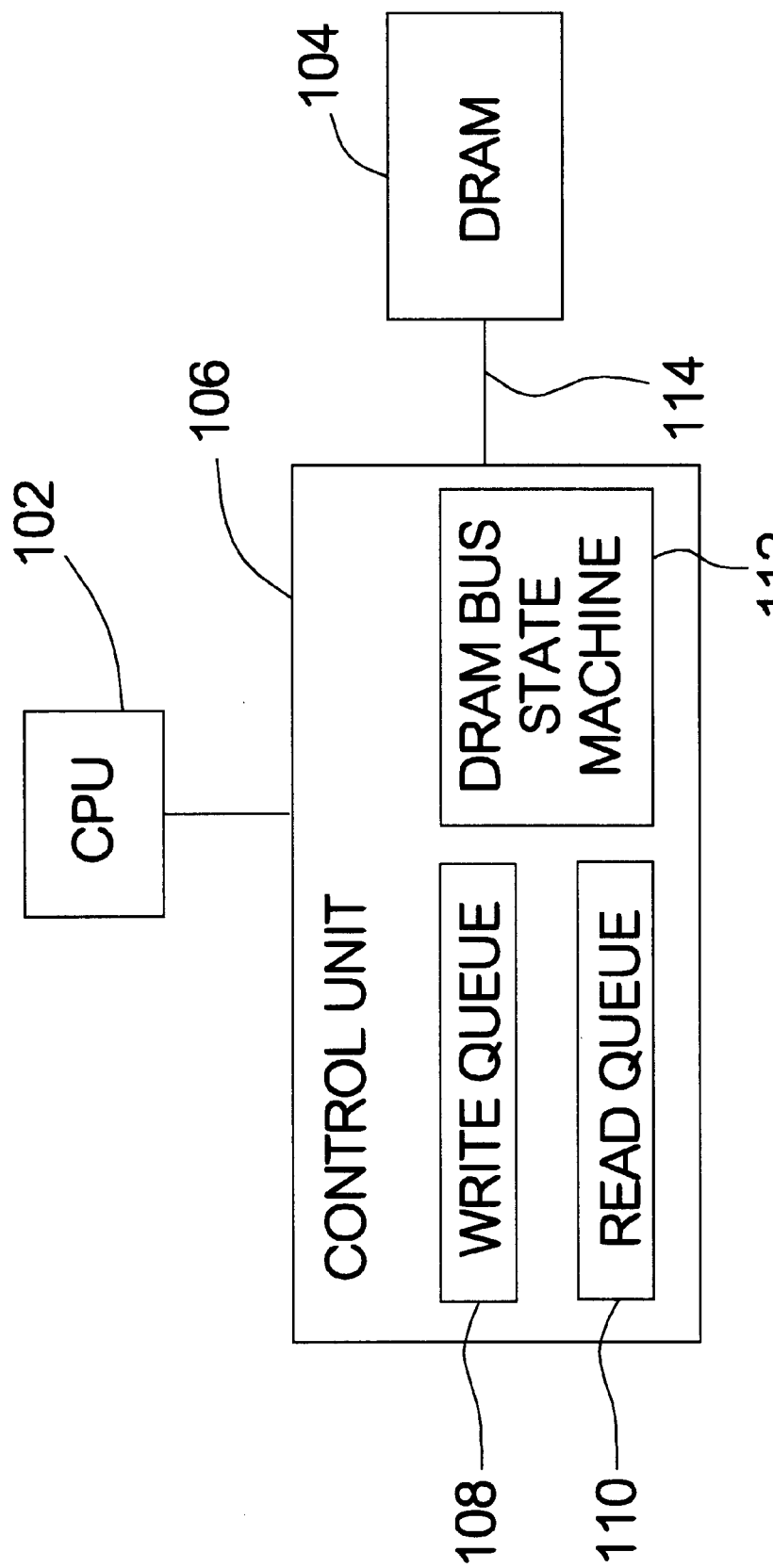
FIG. 1 (Prior Art) shows a block diagram of a part of a computer system.
Figure 2:
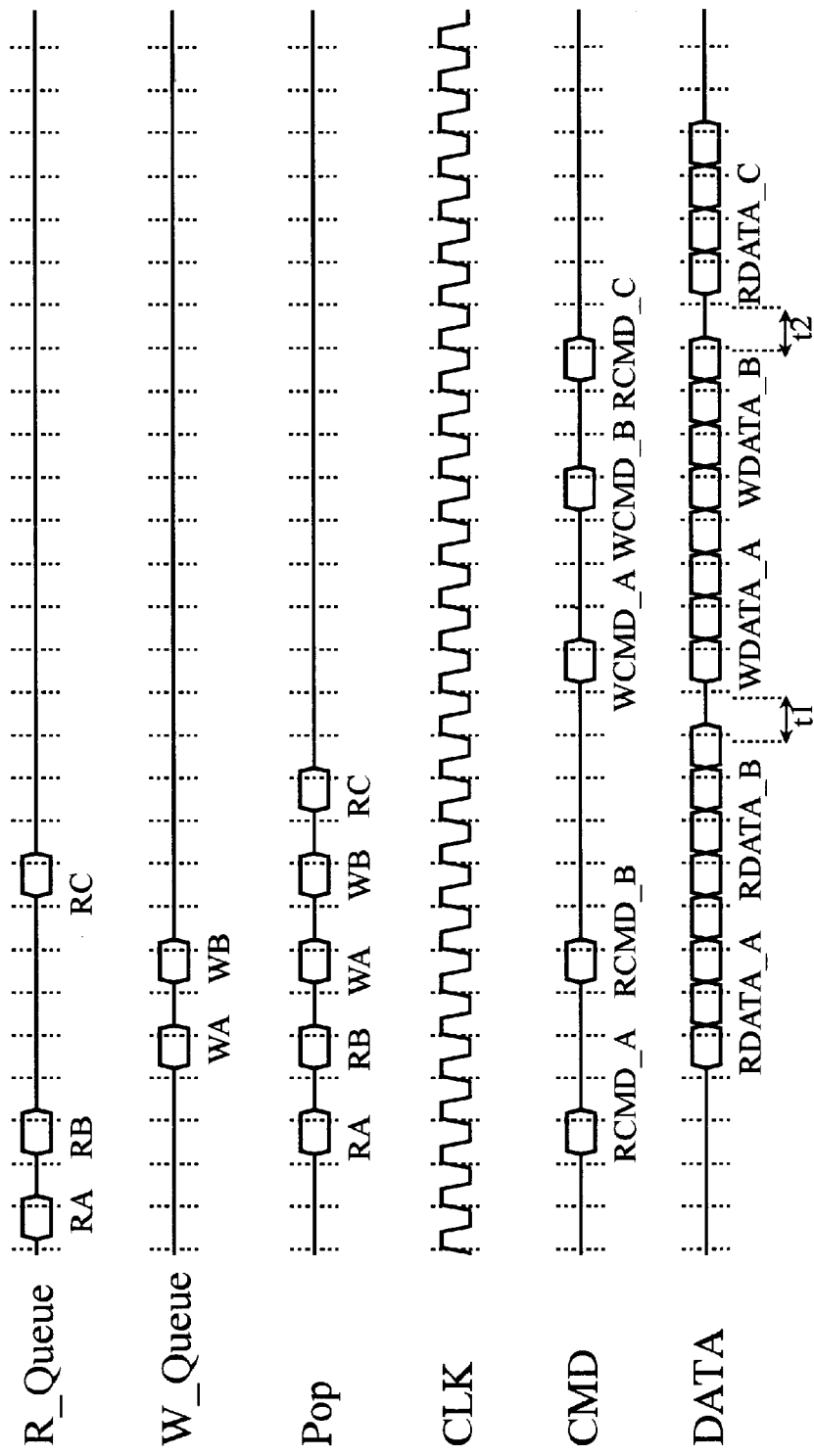
FIG. 2 (Prior Art) is a timing chart for illustrating the CPU performing a write operation to the DRAM according to the conventional method.
Figure 3:
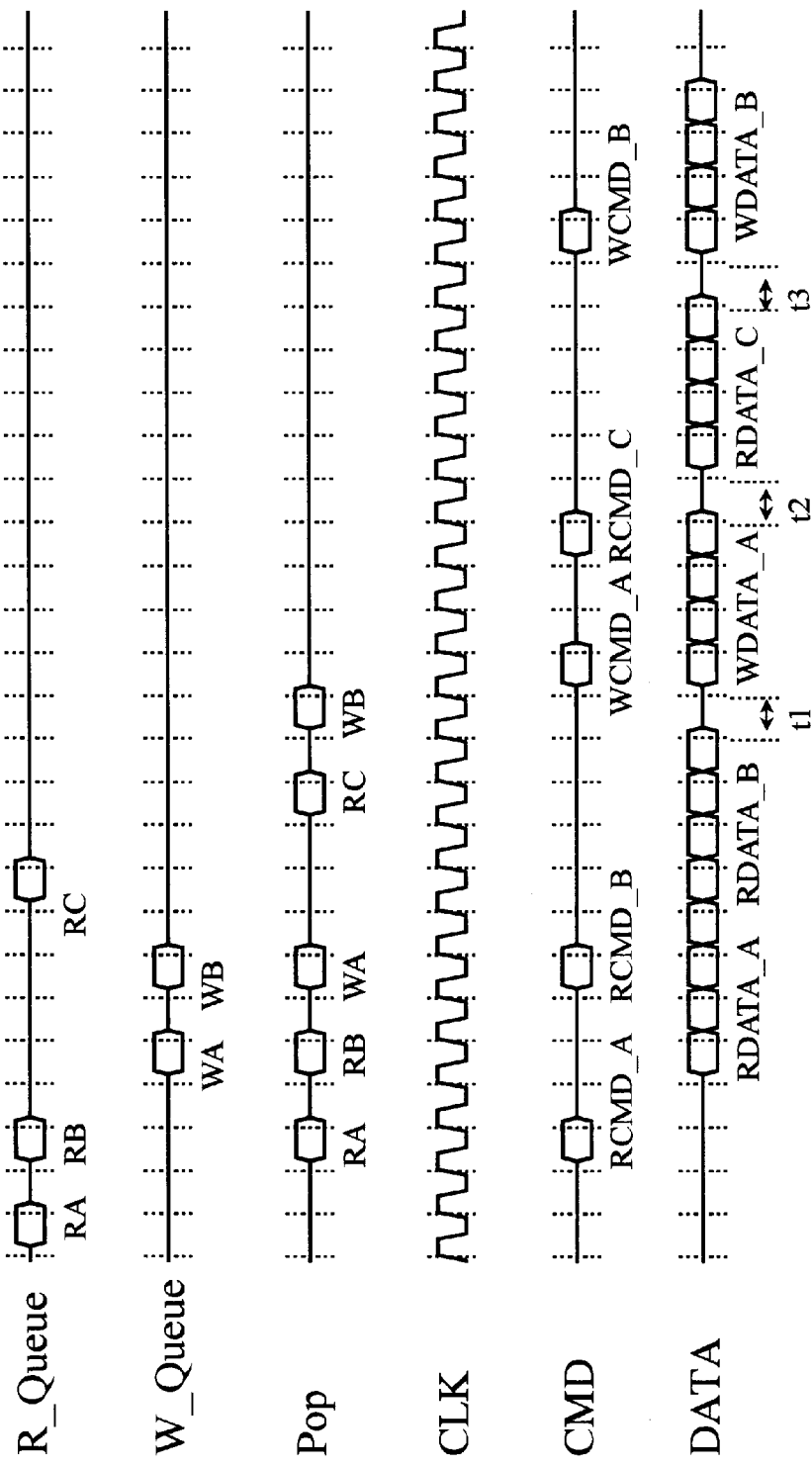
FIG. 3 (Prior Art) is a timing diagram for illustrating the read and write operations using RAPW method.

From FIGS. 5 and 6, according to the scheduling method of the present invention, the read operations can be consecutively executed by detecting the status of the bus data signal line DATA. Accordingly, the CPU 102 can rapidly access the read data RDATA with high program dependence such that the executing speed can be increased without wasting time on waiting for the DRAM 104. In addition, comparing FIGS. 3 and 5, the conventional RAPW method requires three turn around cycles while in the scheduling method of the present invention, only one turn around cycle is needed. Therefore, the number of the turn around cycles is considerably reduced, resulting in an increase of the data transmission speed of the DRAM bus 114 and thus decreasing the time for transmitting data.

However, the method of the present invention is not limited to the data transmission between the CPU and the DRAM. The present method is suitable for all of the read and write operations between two devices. For example, data transmission between peripheral component interface (PCI) master and other peripheral devices. In addition, the method of the present invention is also suitable for a situation that a number of devices simultaneously intend to perform read and write operations to the DRAM.

In summary, the feature of the present invention is to determine whether all of the read data are completely transmitted; i.e., it determines whether data are not being transmitted on the bus data line. If there are no data transmitted on the bus data line, the write operation is activated. In addition, by suitable scheduling of the sequence of the write and read operations, the address hit problem can be solved. Furthermore, almost the same type operations are consecutively executed and therefore the transmission time is significant reduced. As a result, the CPU can rapidly execute programs without wasting time.

While the invention has been described by way of example and in terms of the preferred embodiment, it is to be understood that the invention is not limited to the disclosed embodiment. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for scheduling execution sequence of read and write operations, used for controlling the read and write operations between a first device and a second device, the method comprising the steps of:

(a) determining whether there are any read or write operations waiting to be executed between the first and the second devices;

if so, proceeding to step (b); otherwise ending the method;

(b) determining whether there are more than two write operations waiting to be executed;

if so, proceeding to step (c); otherwise proceeding to step (d);

(c) determining whether all read operations are completed;

if so, proceeding to step (f); otherwise proceeding to step (d);

(d) determining whether there are read operations waiting to be executed;

if so, proceeding to step (e); otherwise repeating said step (c);

(e) determining whether an address hit occurs;

if so, proceeding to step (f); otherwise executing the read operation and then repeating said step (a); and (f) executing the write operations and then repeating said step (a);

wherein the address hit indicates that when the read operation is executed, the write operation next to the read operation is associated with the identical data address associated with the read operation.

2. The method of claim 1, wherein the write operation comprises the steps of:

(a1) pushing a write request into a write queue;

(b1) popping the write request from the write queue; and (c1) sending a write command and a write data from the first device to the second device.

3. The method of claim 2, wherein said step (f) comprises the steps of:

executing the write operation when the write data is ready and then proceeding to said step (a); and repeating said step (d) when the write data is not ready.

4. The method of claim 1, wherein the read operation comprises the steps of:

(a2) pushing a read request into a read queue;

(b2) popping the read request from the read queue;

(c2) sending a read command from the first device to the second device; and (d2) sending a read data from the second device to the first device.

5. The method of claim 1, wherein the first device is a central processing unit (CPU).

6. The method of claim 1, wherein the second device is a dynamic random access memory (DRAM).

7. The method of claim 1, wherein the first device is a peripheral component interface (PCI).

8. The method of claim 1, further comprising a third device used for reading from or writing into the second device.

9. A method for scheduling execution sequence of read and write operations, used for controlling the read and write operations between a first device and a second device, the method comprising the steps of:

(a) ending the method when there are no read or write operations occurring between the first device and the second device;

(b) storing a plurality of read requests of the read operations and a plurality of write requests of the write operations into a read queue and a write queue respectively;

(c) proceeding to step (d) when there are more than two write requests in the write queue while proceeding to step (e) when there are no more than two write requests in the write queue;

(d) proceeding to step (f) when all the read operations are completed, and proceeding to step (e) when not all of the read operations are completed;

(e) proceeding to step (g) when the read requests are still queued in the read queue, and repeating said step (d) when the read requests are not queued in the read queue;

(f) popping the write requests from the write queue and the first device executing the write operations to the second device, and then proceeding to the step (a); and (g) popping one of the read requests from the read queue and the first device executing the read operation to the second device when there is no address hit to be detected while proceeding to said step (f) when an address hit is detected;

wherein the address hit indicates that when the read operation is to be executed, the write operation next to the read operation is associated with the data address which is associated with the read operation.

10. The method of claim 9, wherein said step (f) comprises the steps of:

popping the write requests from the write queue and the first device executing the write operations with the second device and then proceeding to said step (a) when a write data is ready; and proceeding to said step (e) when the write data is not ready.

11. The method of claim 9, wherein the first device is a central processing unit (CPU).

12. The method of claim 9, wherein the second device is a dynamic random access memory (DRAM).

13. The method of claim 9, wherein the first device is a peripheral component interface (PCI).

14. The method of claim 9, further comprising a third device used for reading from or writing into the second device.

15. A method for scheduling execution sequence of read and write operations, used for controlling the read and write operations between a first device and a second device, the method comprising the steps of:

(a) ending the method when no read or write operations are not waiting to be executed between the first and second device;

(b) proceeding to step (c) when there are more than N write operations waiting to be executed, and proceeding to step (d) when there are less-no more than N write operations waiting to be executed;

(c) proceeding to step (f) when all the read operations are completed, and proceeding to step (d) when not all of the read operations are completed;

(d) proceeding to step (e) when there are read operations waiting to be executed, and repeating said step (c) when no read operations are waiting to be executed;

(e) executing the read operations and then proceeding said step (a) when there is no address hit to be detected; otherwise proceeding to step (f); and (f) executing the write operations and then proceeding to said step (a);

wherein the address hit indicates that when the read operation is to be executed, both the read operation and the write operation next to the read operation are associated with an identical data address.

16. The method of claim 15, wherein the N value is greater than 2.

17. A method for scheduling execution sequence of read and write operations, used for controlling the read and write operations between a first device and a second device, the method comprising the steps of:

(a) determining whether there are any read or write operations waiting to be executed between the first and the second devices;

if so, proceeding to step (b); otherwise ending the method;

(b) determining whether there are more than N write operations waiting to be executed, wherein N is a positive integer;

if so, proceeding to step (c); otherwise proceeding to step (d);

(c) determining whether all read operations are completely executed and all read data that correspond to the read operations are being transmitted completely;

if so, proceeding to step (f); otherwise proceeding to step (d);

(d) determining whether there are read operations waiting to be executed;

if so, proceeding to step (e); otherwise repeating said step (c);

(e) determining whether an address hit occurs;

if so, proceeding to step (f); otherwise executing the read operation and then repeating said step (a); and (f) executing the write operations and then repeating said step (a);

wherein the address hit indicates that when the read operation is executed, the write operation next to the read operation is associated with the identical data address associated with the read operation.

18. The method of claim 17, wherein the write operation comprises the steps of:

(a1) pushing a write request into a write queue;

(b1) popping the write request from the write queue; and (c1) sending a write command and a write data from the first device to the second device.

19. The method of claim 18, wherein said step (f) comprises the steps of:

executing the write operation when the write data is ready and then proceeding to said step (a); and repeating said step (d) when the write data is not ready.

20. The method of claim 17, wherein the read operation comprises the steps of:

(a2) pushing a read request into a read queue;

(b2) popping the read request from the read queue;

(c2) sending a read command from the first device to the second device; and (d2) sending a read data from the second device to the first device.

* * * * *